United States Patent
Lee et al.

(10) Patent No.: US 9,299,429 B2
(45) Date of Patent: Mar. 29, 2016

(54) NONVOLATILE MEMORY DEVICE USING A RESISTANCE MATERIAL AND A DRIVING METHOD THEREOF

(71) Applicant: SAMSUNG ELECTRONICS CO., LTD., Suwon-si, Gyeonggi-do (KR)

(72) Inventors: Yong-Jun Lee, Hwaseong-si (KR); Hoi-Ju Chung, Yongin-si (KR); Yong-Jin Kwon, Suwon-si (KR); Hyo-Jin Kwon, Seoul (KR); Eun-Hye Park, Iksan-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 1 day.

(21) Appl. No.: 14/317,162

(22) Filed: Jun. 27, 2014

(65) Prior Publication Data

US 2015/0003137 A1    Jan. 1, 2015

(30) Foreign Application Priority Data

Jun. 27, 2013 (KR) ........................ 10-2013-0074628

(51) Int. Cl.

| | | |
|---|---|---|
| G11C 15/00 | (2006.01) | |
| G11C 13/00 | (2006.01) | |
| G11C 7/10 | (2006.01) | |
| G11C 11/56 | (2006.01) | |

(52) U.S. Cl.
CPC ............ *G11C 13/004* (2013.01); *G11C 7/1039* (2013.01); *G11C 7/1042* (2013.01); *G11C 11/5678* (2013.01); *G11C 11/5685* (2013.01); *G11C 13/0061* (2013.01); *G11C 2213/71* (2013.01); *G11C 2213/72* (2013.01)

(58) Field of Classification Search
CPC .... G11C 15/04; G11C 15/00; G11C 13/0069; G11C 13/0004

USPC ................................................. 365/49.1, 148
See application file for complete search history.

(56) References Cited

U.S. PATENT DOCUMENTS

| | | | |
|---|---|---|---|
| 7,116,578 B2 | 10/2006 | Kanamori et al. | |
| 7,764,551 B2 | 7/2010 | Seo et al. | |
| 7,894,277 B2 | 2/2011 | Lee et al. | |
| 7,920,432 B2 | 4/2011 | Lee et al. | |
| 2004/0019743 A1* | 1/2004 | Au ............................. | G06F 5/10 711/131 |
| 2005/0289291 A1 | 12/2005 | Takahashi | |
| 2014/0063904 A1* | 3/2014 | Yon ....................... | G11C 13/004 365/148 |

FOREIGN PATENT DOCUMENTS

| | | |
|---|---|---|
| JP | 2003-288268 | 10/2003 |
| JP | 2004-326574 | 11/2004 |
| JP | 2007-164355 | 6/2007 |
| JP | 2008-135046 | 6/2008 |
| JP | 2009-123236 | 6/2009 |
| JP | 2009-129478 | 6/2009 |
| JP | 2012-198962 | 10/2012 |

OTHER PUBLICATIONS

US 8,315,110, 11/2012, Mukai et al. (withdrawn)

* cited by examiner

*Primary Examiner* — Huan Hoang
(74) *Attorney, Agent, or Firm* — F. Chau & Associates, LLC

(57) ABSTRACT

A nonvolatile memory device includes a buffer memory, a read circuit configured to read first data stored in the buffer memory in a first read operation, and a write circuit configured to write second data in the buffer memory in a first write operation, wherein the first write operation is performed when a first internal write command is generated during the first read operation.

15 Claims, 8 Drawing Sheets

NONVOLATILE MEMORY DEVICE USING A RESISTANCE MATERIAL AND A DRIVING METHOD THEREOF

CROSS-REFERENCE TO RELATED APPLICATION

This application claims priority under 35 U.S.C. §119 to Korean Patent Application No. 10-2013-0074628 filed on Jun. 27, 2013 in the Korean Intellectual Property Office, the disclosure of which is incorporated by reference herein in its entirety.

TECHNICAL FIELD

The present inventive concept relates to a nonvolatile memory device using a resistance material, and a driving method thereof.

DISCUSSION OF THE RELATED ART

A nonvolatile memory device using a resistance material includes a phase change random access memory (PRAM) or a phase change memory (PCM), a resistive RAM (RRAM), a magnetic RAM (MRAM), and the like. The PRAM stores data by using a state change of a phase change material, such as a chalcogenide alloy, the RRAM stores data by using a resistance change of a variable resistance material, and the MRAM stores data by using a resistance change of a magnetic tunnel junction thin film according to a magnetization state of a ferromagnetic body.

In a PCM for example, a phase change material is changed to a crystalline state or an amorphous state when it is heated and then cooled. The phase change material in the crystalline state has a low resistance, and the phase change material in the amorphous state has a high resistance. The crystalline state may be referred to as set data, and the amorphous state may be referred to as reset data.

SUMMARY

According to an exemplary embodiment of the present inventive concept, there is provided a nonvolatile memory device, comprising, a buffer memory, a read circuit configured to read first data stored in the buffer memory in a first read operation, and a write circuit configured to write second data in the buffer memory in a first write operation, wherein the first write operation is performed when a first internal write command is generated during the first read operation.

The write circuit is configured to write third data in the buffer memory in a second write operation, and the read circuit is configured to immediately read fourth data stored in the buffer memory in a second read operation, wherein the second read operation is performed when an internal read command is generated during the second write operation.

The read circuit is configured to provide a read pointer indicating that the first read operation is performed.

The read circuit enables a read start pointer indicating a start of the first read operation, and disables a read end pointer indicating an end of the first read operation.

The nonvolatile memory device further comprises a read while write controller configured to receive the read start pointer, the read end pointer, and the first internal write command, and queue the first internal write command when the first internal write command is input before the read start pointer is enabled and the read end pointer is disabled.

The buffer memory stores the first data, and a first address of a memory cell array corresponding to the first data.

The memory array includes a nonvolatile memory element including a resistance material.

The buffer memory includes a first in first out buffer.

The buffer memory includes a content addressable memory.

According to an exemplary embodiment of the present inventive concept, there is provided a nonvolatile memory device, comprising, a memory array including a plurality of nonvolatile memory elements including a resistance material, a buffer memory configured to store data stored in the plurality of nonvolatile memory elements, and an address within the memory array in which the data is stored, a read circuit electrically connected to the memory array and the buffer memory, and configured to provide a read pointer which indicates whether data is currently read from the buffer memory, and a write circuit electrically connected with the memory array and the buffer memory, and configured to change a time at which data is written in the buffer memory according to a state of the read pointer.

When the read pointer indicates that the data is currently read, the write circuit performs a write operation after the read operation is ended.

When the read pointer indicates that the data is not currently read, the write circuit immediately performs a write operation.

The buffer memory includes a first in first out buffer.

According to an exemplary embodiment of the present inventive concept, there is provided a method of driving a buffer memory supporting a read while write function, the method comprising, first reading first data stored in the buffer memory, and performing a first write operation after the first read operation is ended, wherein second data is written in the buffer memory during the first write operation and the first write operation is performed when a first internal write command is generated during the first read operation.

According to an exemplary embodiment of the present inventive concept, there is provided a nonvolatile memory device comprising, a buffer memory, a read circuit configured to read first data stored in the buffer memory in a first read operation, and a write circuit configured to write second data in the buffer memory in a first write operation, wherein the first write operation is performed when a first internal write command is generated before the first read operation is started or after the first read operation is ended.

The first write operation is performed immediately after the first internal write command is generated.

The write circuit is configured to write third data in the buffer memory in a second write operation, wherein the second write operation is performed after a second read operation and when a second internal write command is generated during the second read operation.

The read circuit is configured to immediately perform a second read operation in which third data stored in the buffer memory is read in response to an internal read command generated while a second write operation is performed.

The buffer memory stores data and addresses of a memory array.

The read circuit and the write circuit are communicably coupled to the memory array and the buffer memory.

BRIEF DESCRIPTION OF THE DRAWINGS

The above and other features of the present inventive concept will become more apparent by describing in detail exemplary embodiments thereof with reference to the attached drawings in which.

DETAILED DESCRIPTION OF THE EMBODIMENTS

Exemplary embodiments of the present inventive concept will now be described more fully hereinafter with reference to the accompanying drawings. This inventive concept may, however, be embodied in different forms and should not be construed as limited to the embodiments set forth herein. The same reference numbers may indicate the same components throughout the specification and drawings. In the attached figures, the thickness of elements or regions may be exaggerated for clarity.

It will also be understood that when an element is referred to as being "on" another element, it can be directly on the other element, or intervening elements may also be present.

The use of the terms "a" and "an" and "the" and similar referents in the context of describing the inventive concept (especially in the context of the following claims) are to be construed to cover both the singular and the plural, unless otherwise indicated herein.

Hereinafter, exemplary embodiments of the present inventive concept will be described with reference to a phase Change random access memory (PRAM). However, the present inventive concept is applicable to all nonvolatile memory devices using a resistance material, such as a resistive RAM (RRAM) and a ferroelectric RAM (FRAM), for example.

Figure 1:
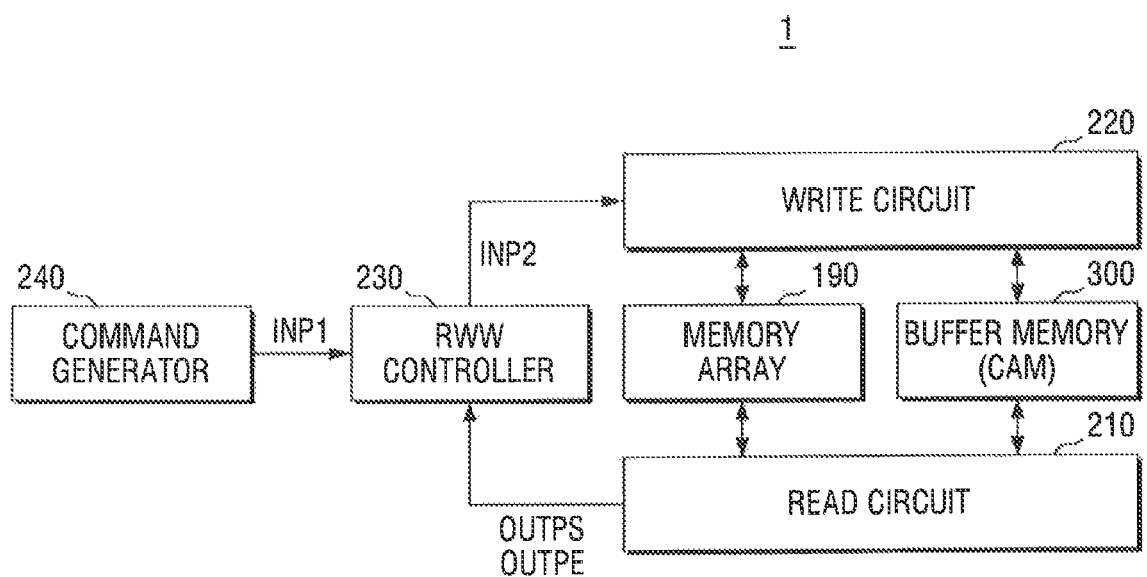
FIG. 1 is a block diagram for describing a nonvolatile memory device according to an exemplary embodiment of the present inventive concept.
Figure 2:
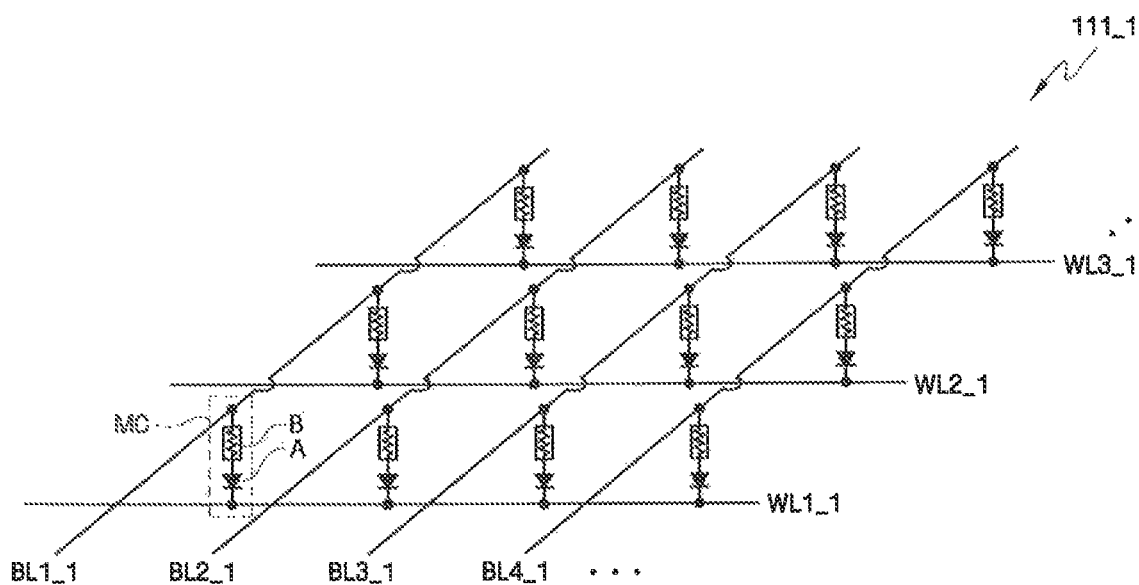
FIGS. 2 and 3 are diagrams for describing a memory array of FIG. 1, according to an exemplary embodiment of the present inventive concept.
Figure 3:
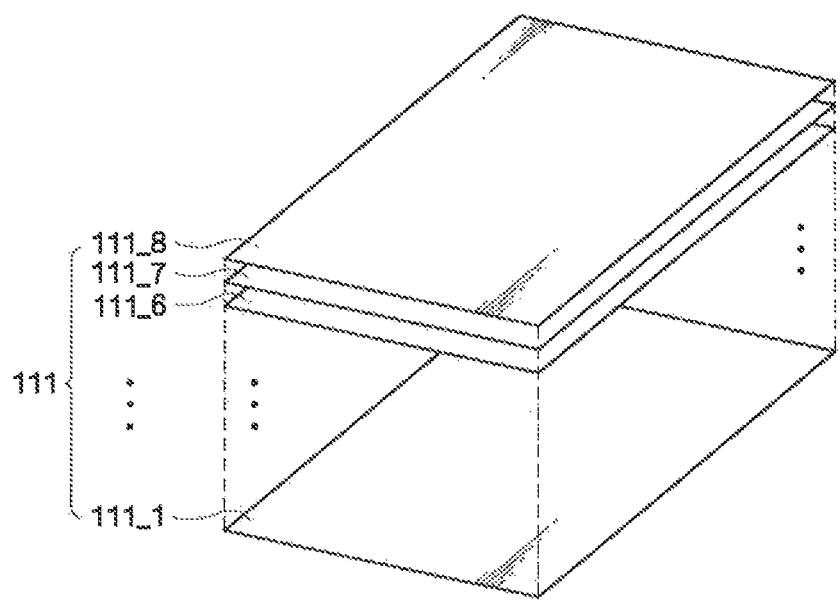
Figure 4:
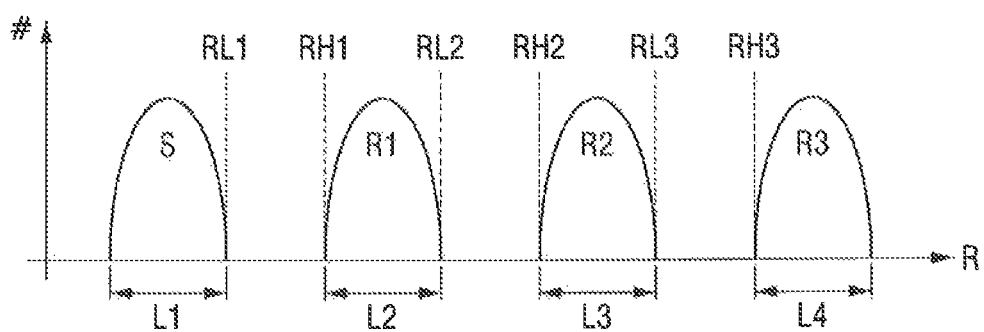
FIGS. 4 and 5 are diagrams for describing a resistance distribution of nonvolatile memory cells used in a nonvolatile memory device according to an exemplary embodiment of the present inventive concept.
Figures 5, 6:
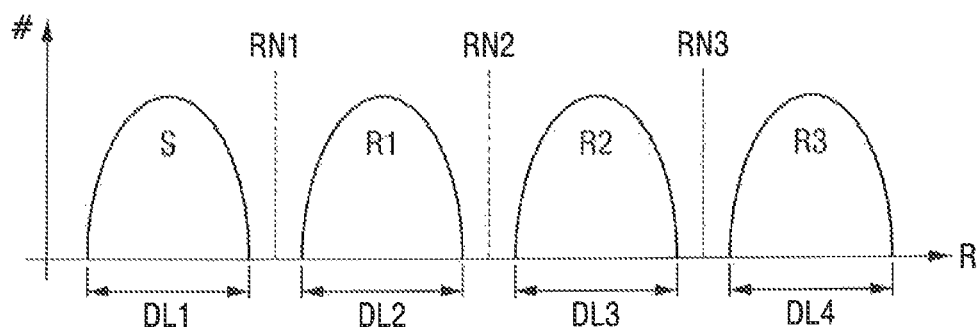
FIGS. 6 and 7 are diagrams for describing a buffer memory of FIG. 1, according to an exemplary embodiment of the present inventive concept.
Figure 7:
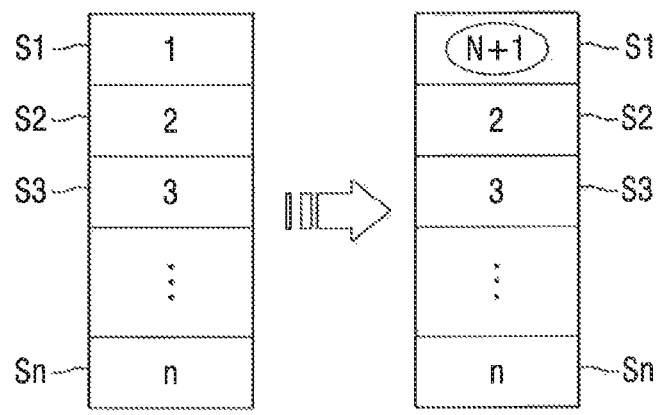

FIG. 1 is a block diagram illustrating a nonvolatile memory device according to an exemplary embodiment of the present inventive concept. FIGS. 2 and 3 are diagrams for describing a memory array of FIG. 1, according to an exemplary embodiment of the present inventive concept. FIGS. 4 and 5 are diagrams for describing a resistance distribution of nonvolatile memory cells used in a nonvolatile memory device according to an exemplary embodiment of the present inventive concept. FIGS. 6 and 7 are diagrams for describing a buffer memory of FIG. 1, according to an exemplary embodiment of the present inventive concept.

First, referring to FIG. 1, a nonvolatile memory device 1 according to an exemplary embodiment of the present inventive concept may include a memory array 190, a buffer memory 300, a read circuit 210, a write circuit 220, a command generator 240, and a read while write (RWW) controller 230. Here, the nonvolatile memory device 1 supports an RWW operation. The read circuit 210 is electrically connected with the memory array 190 and the buffer memory 300, and the write circuit 220 is electrically connected with the memory array 190 and the buffer memory 300.

The memory array 190 may include a plurality of nonvolatile memory cells (see MC of FIG. 2). The nonvolatile memory cell MC may write or read data by using a resistance material. The nonvolatile memory cell MC may include a variable resistor element B including a phase change material of which resistance varies according to stored data, and an access element A for controlling a current flowing in the variable resistor element B. For example, the access element A may be a diode, a transistor, and the like serially coupled with the variable resistor element B. In FIG. 2, a diode is illustrated as the variable resistor element B. For example, various types of materials, such as GaSb, InSb, InSe, $Sb_2Te_3$, and GeTe, in which two elements are combined, GeSbTe, GaSeTe, InSbTe, $SnSb_2Te_4$, and InSbGe, in which three elements are combined, and AgInSbTe, (GeSn)SbTe, GeSb (SeTe), and $Te_{81}Ge_{15}Sb_2S_2$ in which four elements are combined, may be used as the phase change material. Among them, GeSbTe formed of germanium (Ge), antimony (Sb), and tellurium (Te) may be mainly used as the phase change material.

In a case where the nonvolatile memory cell MC is the RRAM, the variable resistor element B may include, for example, NiO or perovskite. Perovskite may be a composition of manganite ($Pr_{0.7}Ca_{0.3}MnO_3$, $Pr_{0.5}Ca_{0.5}MnO_3$, other PCMO types, and LCMO), titanate (STO:Cr), zirconate (SZO:Cr, $Ca_2Nb_2O_7$:Cr, $Ta_2O_5$:Cr), and the like. A filament may be formed inside the variable resistor element B, and the filament becomes a current path of a cell current flowing while passing through the resistive nonvolatile memory cell MC.

The nonvolatile memory cells MC may be arranged in a matrix on a plane 111_1 as shown in FIG. 2. The nonvolatile memory cells MC may be connected to bit lines BL1_1, BL2L_1, BL3_1, BL4_1, and word lines WL1_1, WL2_1, WL3_1, . . . . A plurality of planes 111_1 . . . 111_8 including the nonvolatile memory cells MC arranged in a matrix may form a three-dimensional structure 111.

Further, the buffer memory 300 is used for securing a read operation after writing data in the nonvolatile memory cell MC. In other words, the buffer memory 300 is used for securing a write to read same cell access time (tWTRSC).

Hereafter, this will be described with reference to FIGS. 4 and 5 in detail. The resistance of the nonvolatile memory cell MC immediately after the write operation and the resistance of the nonvolatile memory cell MC after a predetermined time passes may be changed.

As illustrated in FIG. 4, the nonvolatile memory cell MC may be a multi-bit cell. A resistance distribution illustrated in FIG. 4 may be a distribution immediately after the write operation. The nonvolatile memory cell MC may store any one among first to fourth data S, R1, R2, and R3.

The first data S to the fourth data R3 may correspond to first to fourth resistance levels L1, L2, L3, and L4, respectively. A resistance value may be increased in an order of the first to fourth resistance levels L1, L2, L3, and L4. For example, the first resistance level L1 is smaller than RL1, the second resistance level L2 is larger than RH1 and smaller than RL2, the third resistance level L3 is larger than RH2 and smaller than RL3, and the fourth resistance level L4 is larger than RH3. Here, RL1, RL2, RL3, RH1, RH2, and RH3 may be reference values used for a verify read operation which identifies whether the write is accurately performed during the write operation.

A resistance distribution illustrated in FIG. 5 may be a distribution after a predetermined time passes after the write operation. In other words, the first data S to the fourth data R3 may correspond to first to fourth resistance levels DL1, DL2, DL3, and DL4, respectively. It can be seen that compared to widths of the first to fourth resistance levels L1, L2, L3, and L4 illustrated in FIG. 4, widths of the first to fourth resistance levels DL1, DL2, DL3, and DL4 illustrated in FIG. 5 are increased.

RN1 is a resistance value positioned between the first resistance level DL1 and the second resistance level DL2, RN2 is a resistance value positioned between the second resistance level DL2 and the third resistance level DL3, and RN3 is a resistance value positioned between the third resistance level DL3 and the fourth resistance level DL4. Here, RN1 to RN3 may be reference values used for a normal read operation. For example, the resistive nonvolatile memory cell MC having a resistance value smaller than RN1 stores the first data S.

As described above, a time is taken after the data is written in the nonvolatile memory cell MC and then the resistance of the nonvolatile memory cell MC is stabilized. In other words, when the same nonvolatile memory cell MC is read immediately after the data is written, a read error may be generated. The nonvolatile memory device 1 according to an exemplary embodiment of the present inventive concept adopts the buffer memory 300. This way, the read error may not be generated.

Particularly, when the write circuit 220 writes first data in a region (for example, a first nonvolatile memory cell MC) corresponding to a first address within the memory array 190, the write circuit 220 writes the first data and the first address in the buffer memory 300 together. Then, when the first data stored in the first nonvolatile memory cell MC is desired to be read, the read circuit 210 accesses the buffer memory 300 before the memory array 190. When the first address is stored in the buffer memory 300, the read circuit 210 reads the first data corresponding to the first address from the buffer memory 300.

In other words, during a read operation, an address desired to be read and a plurality of addresses stored in the buffer memory 300 are compared with each other. As a result of the comparison, when a hit (or matched) address is found, data corresponding to the hit address is read from the buffer memory 300. When the hit address does not exist in the buffer memory 300, data is read from the memory array 190.

The buffer memory 300 may be, for example, a content addressable memory (CAM) so that both the data and the address may be stored therein.

Further, the buffer memory 300 may have a size by which tWTRSC may be secured.

As illustrated in FIG. 6, the buffer memory 300 may include, for example, n regions S1 to Sn (n is a natural number). Validity flags V1 to Vn, data DATA1 to DATAn, and addresses ADDR1 to ADDRn corresponding to the data DATA1 to DATAn (in other words, the addresses ADDR1 to ADDRn in which the data DATA1 to DATAn are written in the memory array 190) are stored in the regions S1 to Sn. Here, when new data (for example, DATA1) and the address (for example, ADDR1) are stored in the corresponding region (for example, S1), the validity flag (for example, V1) is enabled.

Further, the buffer memory 300 may be a first in first out (FIFO) buffer,

As illustrated in FIG. 7, a case in which all of the regions S1 to Sn within the buffer memory 300 are filled with the data/address will be considered. For example, when all of the regions S1 to Sn are filled with the data/address in an order of the region S1 to the region Sn, $n+1^{th}$ data/address are written in the region S1 in which the data/address are first filled. In other words, the first data/address stored in the region S1 are erased.

In addition, since the nonvolatile memory device 1 according to an exemplary embodiment of the present inventive concept supports the RWW operation, the buffer memory 300 may also perform the RWW operation. In other words, the data may also be read from the buffer memory 300 during the write of the data in the buffer memory 300.

However, an internal write command commanding the write of the data in the buffer memory 300 may be generated while all of the regions S1 to Sn are filled with the data/address in the order of the region S1 to the region Sn, and the data stored in the region S1 of the buffer memory 300 is read. In this case, when the write operation is performed according to the internal write command, the data is written in the region S1 of the buffer memory 300. In other words, the data stored in the region S1 is changed during the performance of the read operation from the region S1. Reliability of the read operation can thus deteriorate.

In the nonvolatile memory device 1 according to an exemplary embodiment of the present inventive concept, even though the internal write command commanding the write of the data in the buffer memory 300 is generated while the data is read from the buffer memory 300, the write operation according to the internal write command is performed after the read operation ends. Reliability of the read operation can thus improve. In addition, when the internal write command is generated before the read operation is started or after the read operation is ended, the write operation may be immediately performed in response to the internal write command.

Further, even though an internal read command commanding the read of the data from the buffer memory 300 is generated while the write operation is performed on the buffer memory 300, the read circuit 210 may immediately perform the read operation corresponding to the internal read command.

To perform these operations, for example, the read circuit 210 may provide a read pointer indicating that the read operation is performed, and whether to immediately perform the write operation (in other words, whether to delay the write operation) may be determined according to a state of the read pointer.

The command generator 240 receives an external write command, and generates an internal write command corresponding to the received external write command. For example, when the command generator 240 receives the external write command commanding the continuous performance of the write 10 times, the command generator 240 may continuously generate a first internal write command INP1 10 times.

The RWW controller 230 receives read pointers OUTPS and OUTPE and the first internal write command INP1. The RWW controller 230 may queue the first internal write command INP1, or immediately provide a second internal write command INP2 to the write circuit 220 according to the states of the read pointers OUTPS and OUTPE. In other words, when the read pointers OUTPS and OUTPE indicate that the read operation is currently performed, the RWW controller 230 queues the first internal write command INP1, and provides the second internal write command INP2 to the write circuit 220 when the read operation is ended. Further, When the read pointers OUTPS and OUTPE indicate that the read operation is not performed, the RWW controller 230 immediately generates the second internal write command INP2. The exemplified operation will be described below in detail with reference to FIGS. 8 to 11.

Further, the read pointers OUTPS and OUTPE may include, for example, a read start pointer OUTPS indicating a start of the read operation, and a read end pointer OUTPE indicating an end of the read operation. Here, the read start pointer OUTPS and the read end pointer OUTPE are exemplified as a type of the read pointers OUTPS and OUTPE, but the type of the read pointers OUTPS and OUTPE is not limited thereto. For example, the read pointers OUTPS and OUTPE may also be implemented as a signal maintaining a high level throughout a read section.

The read circuit 210 may enable the read start pointer OUTPS when the read operation is started, and enable the read end pointer OUTPE indicating the end of the read operation when the read operation is ended.

Figure 8:
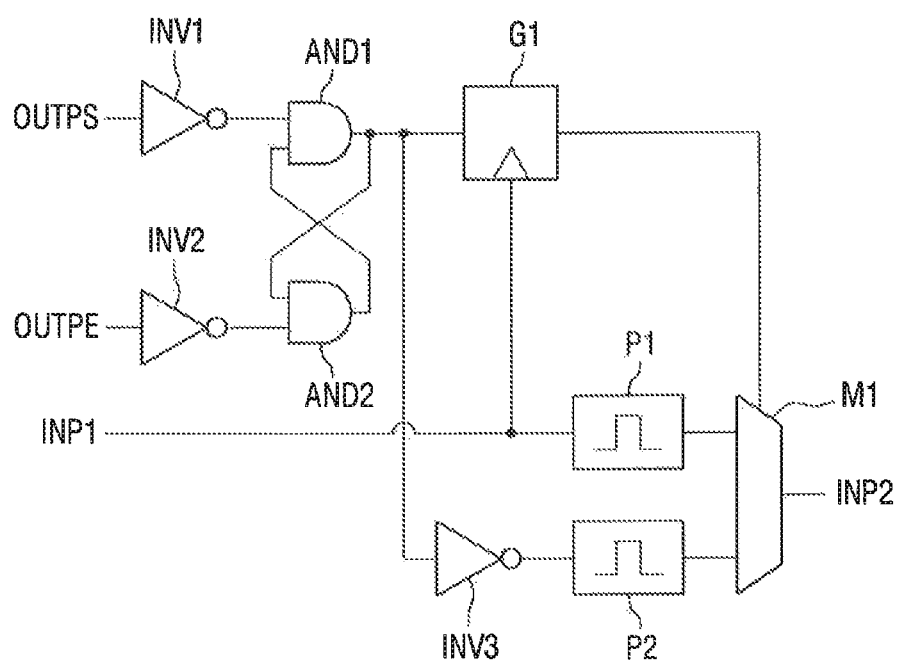
FIG. 8 is a diagram for describing a read while write controller of FIG. 1, according to an exemplary embodiment of the present inventive concept.

FIG. 8 is a diagram for describing the RWW controller 230 of FIG. 1, according to an exemplary embodiment of the present inventive concept.

Referring to FIG. 8, the RWW controller 230 may include first to third inverters INV1 to INV3, first and second AND operators AND1 to AND2, first and second pulse generators P1 and P2, a transfer unit G1, and a MUX M1.

The read start pointer OUTPS is input to the first inverter INV1, and the read end pointer OUTPE is input to the second inverter INV2.

An output value of the second AND operator AND2, and an inverse value of the read start pointer OUTPS are input to the first AND operator AND1.

An output value of the first AND operator AND1, and an inverse value of the read end pointer OUTPE are input to the second AND operator AND2.

An output value of the first AND operator AND1 is input to the third inverter INV3, and an output value of the third inverter INV3 is input to the second pulse generator P2. The first internal write command INP1 is input to the transfer unit G1 and the first pulse generator P1.

The MUX M1 may provide an output of the first pulse generator P1 as the second internal write command INP2, or an output of the second pulse generator P2 as the second internal write command INP2 according to an output of the transfer unit G1.

Figure 9:
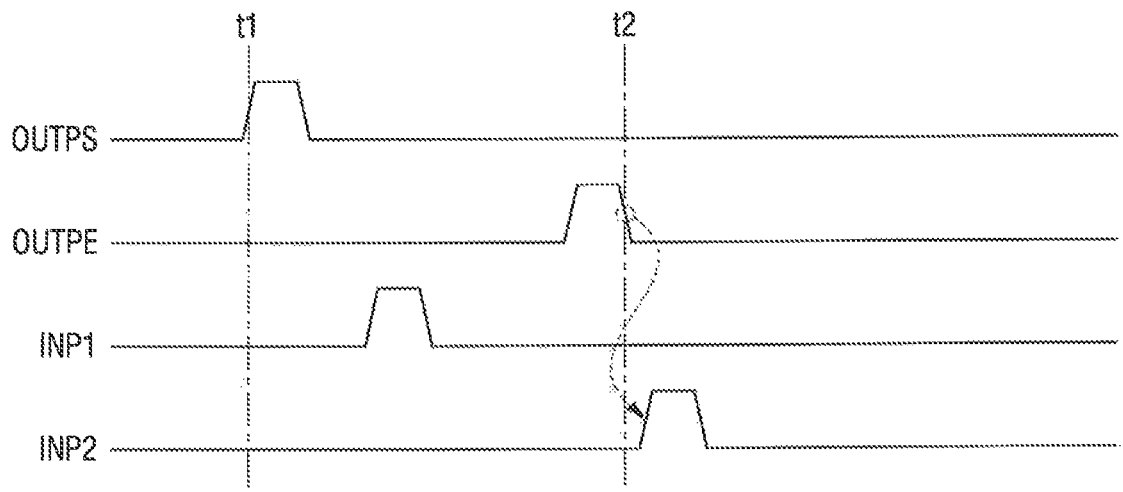
FIGS. 9 to 11 are tinting diagrams for describing a driving method of a nonvolatile memory device according to an exemplary embodiment of the present inventive concept.
Figure 10:
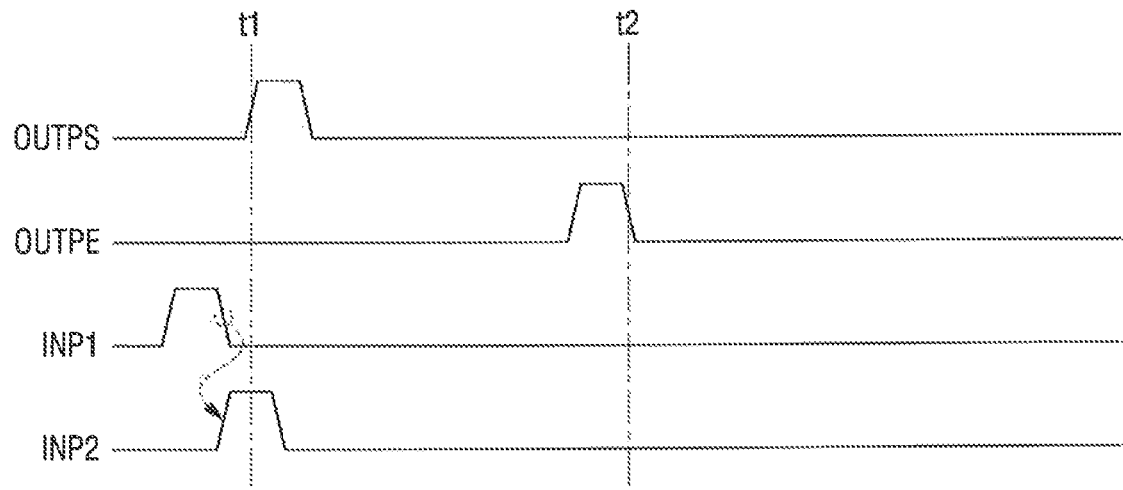
Figure 11:
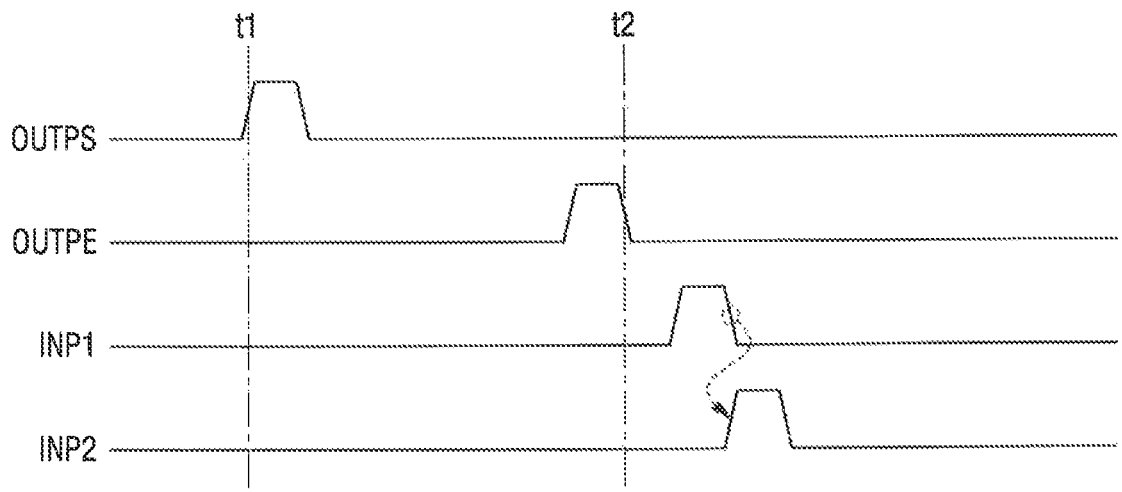

FIGS. 9 to 11 are timing diagrams for describing a driving method of a nonvolatile memory device according to an exemplary embodiment of the present inventive concept.

First, referring to FIG. 9, the read start pointer OUTPS is enabled at a time t1, and the read end pointer OUTPE is disabled at a time t2. In other words, a section in which the read operation is performed is an interval between an enable time of the read start pointer OUTPS and a disable time of the read end pointer OUTPE.

Since the first internal write command INP1 is input between the time t1 and the time t2, and the interval section is the section in which the read operation is performed, the RWW controller 230 does not immediately generate the second internal write command INP2. After the read operation is ended (in other words, after the disable time of the read end pointer OUTPE), the RWW controller 230 provides the second internal write command INP2 to the write circuit 220.

Referring to FIG. 10, the first internal write command INP1 is generated before the time t1 (in other words, before the read start pointer OUTPS is generated). Since the first internal write command INP1 is generated before the read operation is started, the RWW controller 230 receives the first internal write command INP1, and immediately provides the second internal write command INP2 to the write circuit 220.

Referring to FIG. 11, the first internal write command INP1 is generated after the time t2 (in other words, before the read end pointer OUTPE is generated). Since the first internal write command INP1 is generated after the read operation is ended, the RWW controller 230 receives the first internal write command INP1, and immediately provides the second internal write command INP2 to the write circuit 220.

Figure 12:
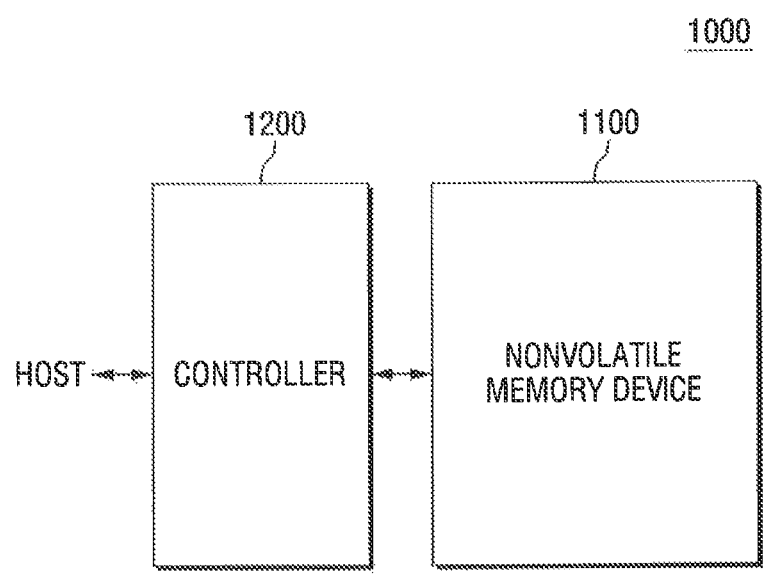
FIG. 12 is a block diagram illustrating a memory system according to an exemplary embodiment of the present inventive concept.

FIG. 12 is a block diagram illustrating a memory system according to an exemplary embodiment of the present inventive concept.

Referring to FIG. 12, a memory system 1000 includes a nonvolatile memory device 1100 and a controller 1200.

The nonvolatile memory device 1100 may be configured and operated in such a manner as described with reference to FIGS. 1 to 11.

The controller 1200 is connected to a host and the nonvolatile memory device 1100. The controller 1200 is configured to access the nonvolatile memory device 1100 in response to a request from the host. For example, the controller 1200 is configured to control read, write, erase, and background operations of the nonvolatile memory device 1100. The controller 1200 is configured to provide an interface between the nonvolatile memory device 1100 and the host. The controller 1200 is configured to drive a firmware for controlling the nonvolatile memory device 1100.

For example, the controller 1200 includes constituent elements, such as a RAM, a processing unit, a host interface, and a memory interface. The RAM is used as a working memory of the processing unit, a cache memory between the nonvolatile memory device 1100 and the host, or a buffer memory between the nonvolatile memory device 1100 and the host. The processing unit controls a general operation of the controller 1200.

The host interface includes a protocol for performing a data exchange between the host and the controller 1200. For example, the controller 1200 is configured to communicate with an external device (the host) through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol. The memory interface interfaces with the nonvolatile memory device 1100. For example, the memory interface includes a NAND interface or a NOR interface.

The memory system 1000 may be configured to additionally include an error correction block. The error correction block is configured to detect and correct an error of data read from the nonvolatile memory device 1100 by using an error correction code (ECC). For example, the error correction block is provided as an element of the controller 1200. The error correction block may be provided as an element of the nonvolatile memory device 1100.

The controller 1200 and the nonvolatile memory device 1100 may be integrated as one semiconductor device. For example, the controller 1200 and the nonvolatile memory device 1100 may be integrated as one semiconductor device to configure a memory card. For example, the controller 1200 and the nonvolatile memory device 1100 may be integrated as one semiconductor device to configure a memory card, such as a PC card (e.g., a personal computer memory card international association (PCMCIA) card), a compact flash (CF) card, smart media cards (SM and SMC), a memory stick, multimedia cards (MMC, reduced size (RS)-MMC, and MMCmicro), secure digital (SD) cards (SD, miniSD, microSD, and SD high capacity (SDHC)), and a universal flash storage (UFS).

The controller 1200 and the nonvolatile memory device 1100 may be integrated as one semiconductor device to configure a semiconductor drive (e.g., a solid state drive (SSD)). The SSD includes a storage device configured to store data in a semiconductor memory. In a. case where the memory system 1000 is used as the SSD, a speed of the operation of the host connected to the memory system 1000 is increased.

As another example, the memory system 1000 is provided as one of various elements of an electronic device, such as a computer, an ultra mobile PC (UMPC), a workstation, a netbook computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a 3-dimensional television, a digital audio recorder, a digital audio player, a digital picture recorder, a digital picture player, a digital video recorder, a digital video player, a device capable of transceiving information in a wireless environment, one of various electronic devices configuring a home network, one of various electronic devices configuring a computer network, one of various electronic devices configuring a telematics network, a radio frequency identification (RFID)) device, or one of various elements devices configuring a computing system.

For example, the nonvolatile memory device 1100 or the memory system 1000 may be mounted in various types of packages. For example, the nonvolatile memory device 1100 or the memory system 1000 may be packaged and mounted by a method, such as package on package (PoP), ball grid arrays (BGAs), chip scale packages (CSPs), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), and wafer-level processed stack package (WSP).

Figure 13:
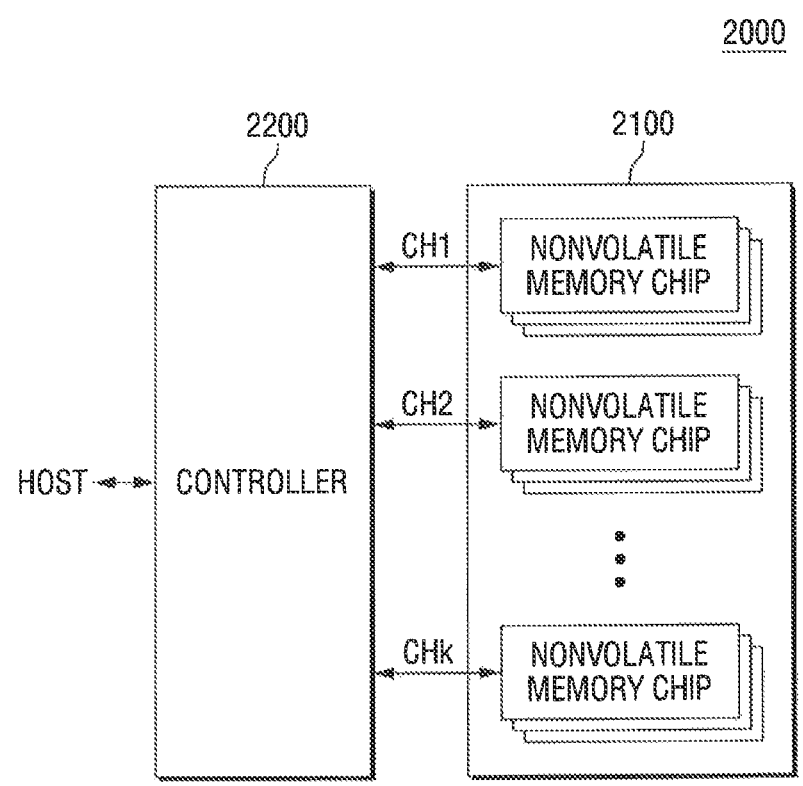
FIG. 13 is a block diagram illustrating an application of the memory system of FIG. 12, according to an exemplary embodiment of the present inventive concept.

FIG. 13 is a block diagram illustrating an application of the memory system of FIG. 12, according to an exemplary embodiment of the present inventive concept.

Referring to FIG. 13, a memory system 2000 includes a nonvolatile memory device 2100 and a controller 2200. The nonvolatile memory device 2100 includes a plurality of nonvolatile memory chips. The plurality of nonvolatile memory chips is divided into a plurality of groups. Each group of the plurality of nonvolatile memory chips is configured to communicate with the controller 2200 through one common channel. For example, it is illustrated that the plurality of nonvolatile memory chips communicates with the controller 2200 through first to $k^{th}$ channels CH1 to CHk. The controller 2200 may communicate with a host.

Each nonvolatile memory chip is similarly configured like the nonvolatile memory device 1 described with reference to FIGS. 1 to 11.

In FIG. 13, it is described that a group of the plurality of nonvolatile memory chips is connected to one channel. However, the memory system 2000 may be modified so that just one nonvolatile memory chip is connected to one channel.

Figure 14:
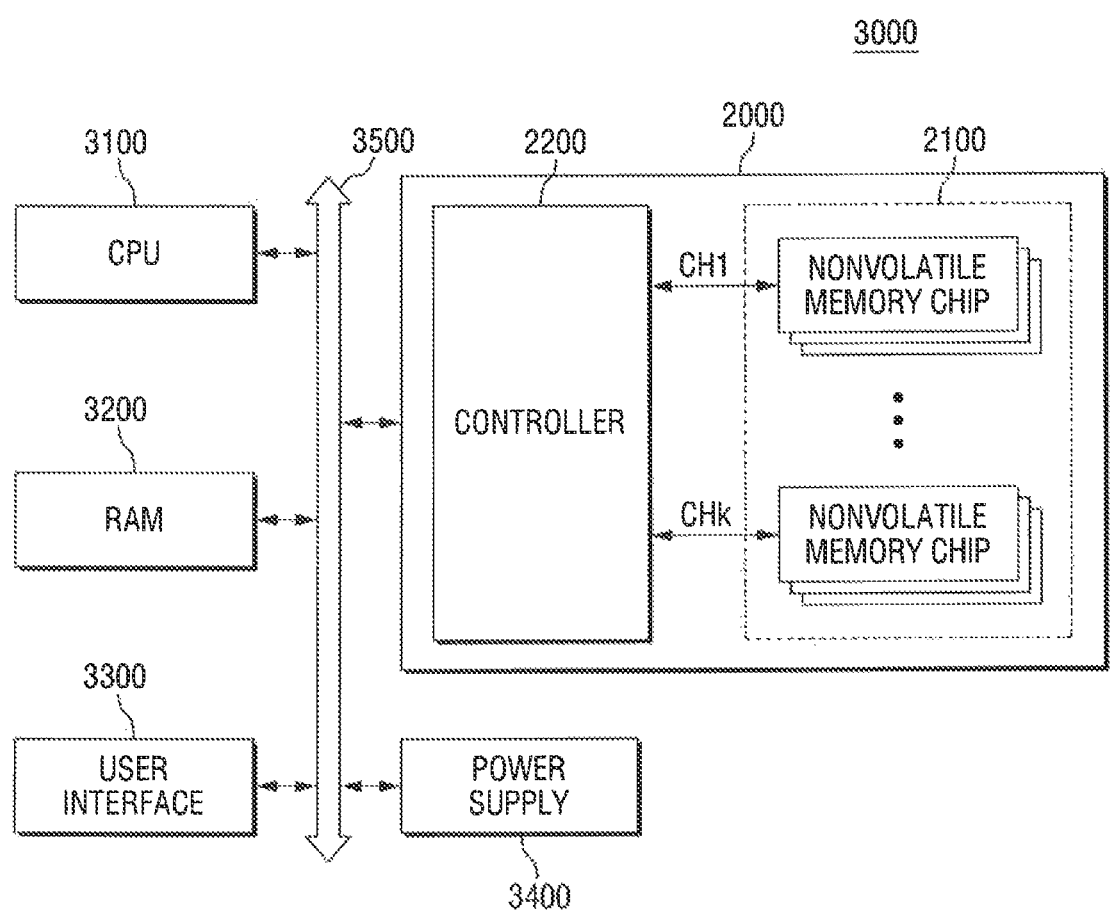
FIG. 14 is a block diagram illustrating a computing system including the memory system described with reference to FIG. 13, according to an exemplary embodiment of the present inventive concept.

FIG. 14 is a block diagram illustrating a computing system including the memory system described with reference to FIG. 13, according to an exemplary embodiment of the present inventive concept.

Referring to FIG. 14, a computing system 3000 includes a central processing unit 3100, a RAM 3200, a user interface 3300, a power supply 3400, and the memory system 2000.

The memory system 2000 is electrically connected to the central processing unit 3100, the RAM 3200, the user interface 3300, and the power supply 3400 through a system bus 3500. Data provided through the user interface 3300 or processed by the central processing unit 3100 is stored in the memory system 2000.

In FIG. 14, it is illustrated that the nonvolatile memory device 2100 is connected to the system bus 3500 through the controller 2200. However, the nonvolatile memory device 2100 may be configured to be directly connected to the system bus 3500.

While the present inventive concept has been particularly shown and described with reference to exemplary embodiments thereof, it will be understood by those of ordinary skill in the art that various changes in form and detail may be made therein without departing from the spirit and scope of the present inventive concept as defined by the following claims.

What is claimed is:

1. A nonvolatile memory device, comprising:
    a buffer memory;
    a read circuit configured to read first data stored in the buffer memory in a first read operation;
    a write circuit configured to write second data in the buffer memory in a first write operation, wherein the first write operation is performed after the first read operation is ended and when a first internal write command is generated during the first read operation;
    a command generator configured to generate the first internal write command; and
    a read while write controller configured to receive the first internal write command from the command generator, receive a read start pointer from the read circuit indicating a start of the first read operation, queue the first internal write command while the first read operation is being performed, receive a read end pointer from the read circuit when the first read operation is ended, and provide a second internal write command to the write circuit when the first read operation is ended to instruct the write circuit to perform the first write operation.

2. The nonvolatile memory device of claim 1, wherein the write circuit is configured to write third data in the buffer memory in a second write operation, and
    the read circuit is configured to immediately read fourth data stored in the buffer memory in a second read operation, wherein the second read operation is performed when an internal read command is generated during the second write operation.

3. The nonvolatile memory device of claim 1, wherein the buffer memory stores the first data, and a first address of a memory cell array corresponding to the first data.

4. The nonvolatile memory device of claim 3, wherein the memory array includes a nonvolatile memory element including a resistance material.

5. The nonvolatile memory device of claim 1, wherein the buffer memory includes a first in first out buffer.

6. The nonvolatile memory device of claim 1, wherein the buffer memory includes a content addressable memory.

7. A nonvolatile memory device, comprising:
a memory array including a plurality of nonvolatile memory elements including a resistance material;
a buffer memory configured to store data stored in the plurality of nonvolatile memory elements, and an address within the memory array in which the data is stored;
a read circuit electrically connected to the memory array and the buffer memory, and configured to provide a read pointer which indicates whether data is currently read from the buffer memory;
a write circuit electrically connected with the memory array and the buffer memory, and configured to change a time at which data is written in the buffer memory according to a state of the read pointer;
a command generator configured to generate a first internal write command; and
a read while write controller configured to receive the first internal write command from the command generator,
wherein when the read pointer indicates the data is currently read, the read while write controller:
queues the first internal write command and waits until receiving the read pointer indicating the data is not currently read before instructing the write circuit to perform a write operation corresponding to the first internal write command; and
when the read pointer indicates the data is not currently read, the read while write controller:
immediately performs a write operation corresponding to the first internal write command.

8. The nonvolatile memory device of claim 7, wherein the buffer memory includes a first in first out buffer.

9. A method of driving a buffer memory supporting a read while write function, the method comprising:
first reading first data stored in the buffer memory using a read circuit; and
performing a first write operation after the first read operation is ended using a write circuit,
wherein second data is written in the buffer memory during the first write operation and the first write operation is performed when a first internal write command is generated during the first read operation,
wherein a read while write controller receives the first internal write command from a command generator, receives a read start pointer from the read circuit indicating a start of the first read operation, queues the first internal write command while the first read operation is being performed, receives a read end pointer from the read circuit when the first read operation is ended, and provides a second internal write command to the write circuit when the first read operation is ended to instruct the write circuit to perform the first write operation.

10. A nonvolatile memory device, comprising:
a buffer memory;
a read circuit configured to read first data stored in the buffer memory in a first read operation;
a write circuit configured to write second data in the buffer memory in a first write operation, wherein the first write operation is performed when a first internal write command is generated before the first read operation is started or after the first read operation is ended; and
a read while write controller electrically connected to the read circuit and the write circuit, the read while write controller comprising:
a first inverter receiving a read pointer indicating data is currently being read;
a second inverter receiving a read pointer indicating data is not currently being read;
a first logic gate having a first input connected to an output of the first inverter;
a second logic gate having a first input connected to an output of the second inverter, a second input connected to an output of the first logic gate, and having an output connected to a second input of the first logic gate;
a transfer unit receiving the output of the first logic gate and a first internal write command from a command generator;
a third inverter receiving the output of the first logic gate;
a first pulse generator receiving the first internal write command;
a second pulse generator receiving an output of the third inverter; and
a multiplexer providing an output of the first pulse generator as a second internal write command or an output of the second pulse generator as the second internal write command according to an output of the transfer unit.

11. The nonvolatile memory device of claim 10, wherein the first write operation is performed immediately after the first internal write command is generated.

12. The nonvolatile memory device of claim 10, wherein the write circuit is configured to write third data in the buffer memory in a second write operation, wherein the second write operation is performed after a second read operation and when the second internal write command is generated during the second read operation.

13. The nonvolatile memory device of claim 10, wherein the read circuit is configured to immediately perform a second read operation in which third data stored in the buffer memory is read in response to an internal read command generated while a second write operation is performed.

14. The nonvolatile memory device of claim 10, wherein the buffer memory stores data and addresses of a memory array.

15. The nonvolatile memory device of claim 10, wherein the read circuit and the write circuit are communicably coupled to the memory array and the buffer memory.

* * * * *